United States Patent [19]

Tsukahara et al.

[11] Patent Number: 4,735,884

[45] Date of Patent: Apr. 5, 1988

[54] LIGHT-SENSITIVE MATERIAL CONTAINING SILVER HALIDE, REDUCING AGENT AND POLYMERIZABLE COMPOUND

[75] Inventors: Jiro Tsukahara; Taku Nakamura, both of Minami-ashigara, Japan

[73] Assignee: Fuji Photo Film Co., Ltd., Kanagawa, Japan

[21] Appl. No.: 18,266

[22] Filed: Feb. 24, 1987

[30] Foreign Application Priority Data

Feb. 26, 1986 [JP] Japan .................................. 61-42746

[51] Int. Cl.$^4$ ............................ G03C 5/42; G03C 5/54
[52] U.S. Cl. ..................................... 430/138; 430/203; 430/435; 430/484; 430/353; 430/566; 430/617; 430/619; 430/620
[58] Field of Search ................ 430/138, 203, 617, 619, 430/620, 435, 484, 566, 353

[56] References Cited

U.S. PATENT DOCUMENTS

| | | | |
|---|---|---|---|
| 3,746,542 | 7/1973 | Hayakana et al. | 430/292 |
| 4,560,637 | 12/1985 | Maeda et al. | 430/436 |
| 4,629,676 | 12/1986 | Hayakana et al. | 430/292 |
| 4,649,098 | 3/1987 | Takeda | 430/281 |

*Primary Examiner*—Paul R. Michl
*Assistant Examiner*—Patrick A. Doody

*Attorney, Agent, or Firm*—Sughrue, Mion, Zinn, Macpeak and Seas

[57] ABSTRACT

A light-sensitive material comprising a light-sensitive layer which contains silver halide, a reducing agent and a polymerizable compound provided on a support, characterized in that the reducing agent is a hydrazine derivative having the following formula (I):

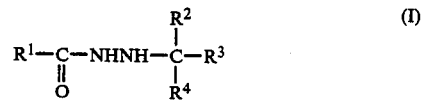

in which $R^1$ is a monovalent group selected from the group consisting of hydrogen, an alkyl group, a cycloalkyl group, an alkenyl group, an aryl group, an aralkyl group, an alkynyl group and a heterocyclic group, each of which may have one or more substituent groups; each of $R^2$ and $R^3$ independently is an aryl group which may have one or more substituent group, or $R^2$ and $R^3$ form, together with the neighboring carbon, a condensed aromatic ring; $R^4$ is a monovalent group selected from the group consisting of an aryl group, a heterocyclic group, hydrogen, an alkyl group, an alkoxycarbonyl group and carbamoyl, each of which may have one or more substituent groups. Image-forming method utilizing the light-sensitive material is also disclosed.

17 Claims, No Drawings

LIGHT-SENSITIVE MATERIAL CONTAINING SILVER HALIDE, REDUCING AGENT AND POLYMERIZABLE COMPOUND

BACKGROUND OF THE INVENTION

1. Field of the Invention

This invention relates to a light-sensitive material comprising a light-sensitive layer containing silver halide, a reducing agent and a polymerizable compound provided on a support, and image-forming method employing the light-sensitive material.

2. Description of Prior Arts

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (coresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

In the light-sensitive material employed in these image forming method, the reducing agent has a function of reducing the silver halide and/or a function of accelerating polymerization of the polymerizable compound. The above publications describe examples of the reducing agents having these functions, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidiopyrazolotriazoles, α-sulfonamidoketones, hydrazines, etc. For example, Japanese Patent Provisional Publication No. 58(1983)-107529 (corresponding to U.S. Pat. No. 4,560,637) describes a hydrazine derivative.

SUMMARY OF THE INVENTION

An object of the present invention is to provide a light-sensitive material which gives an improved clear image.

There is provided by the present invention a light-sensitive material comprising a light-sensitive layer which contains silver halide, a reducing agent and a polymerizable compound provided on a support, characterized in that the reducing agent is a hydrazine derivative having the following formula (I):

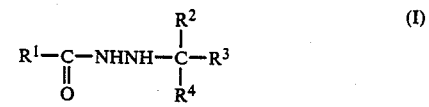

in which $R^1$ is a monovlalent group selected from the group consisting of hydrogen, an alkyl group, a cycloalkyl group, an alkenyl group, an aryl group, an aralkyl group, an alkynyl group and a heterocyclic group, each of which may have one or more substituent groups; each of $R^2$ and $R^3$ independently is an aryl group which may have one or more substituent groups, or $R^2$ and $R^3$ form, together with the neighboring carbon, a condensed aromatic ring; $R^4$ is a monovalent group selected from the group consisting of an aryl group, a heterocyclic group, hydrogen, an alkyl group, an alkoxycarbonyl group and carbamoyl, each of which may have one or more substituent groups.

The light-sensitive material of the invention can be advantageously used in a process which comprises:

imagewise exposing the light-sensitive material to form a latent image of the silver halide, and heating the light-sensitive material either simultaneously with or after the imagewise exposure to polymerize the polymerizable compound within the area where the latent image of the silver halide has been formed.

The light-sensitive material of the invention is characterized in that the light-sensitive layer contains therein the above hydrazine derivative as the reducing agent.

The present inventors have found that the above hydrazine derivative has an excellent function as the reducing agent for the light-sensitive material. The hydrazine derivative can be oxidized and very rapidly decomposed in a heat development process to form a radical which initiates the polymerization. Namely, in the image formation employing the light-sensitive material of the invention, the polymerization reaction is much accelerated. Therefore, the light-sensitive material of the invention can give an improved clear image having a high contrast, within a short development time.

DETAILED DESCRIPTION OF THE INVENTION

The hydrazine derivative employed in the present invention has the following formula (I):

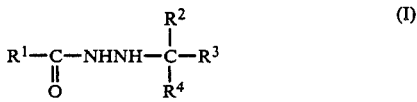

in which $R^1$ is a monovalent group selected from the group consisting of hydrogen, an alkyl group, a cycloalkyl group, an alkenyl group, an aryl group, an aralkyl group, an alkynyl group and a heterocyclic group, each of which may have one or more substituent groups; each of $R^2$ and $R^3$ independently is an aryl group which may have one or more substituent groups, or $R^2$ and $R^3$ form, together with the neighboring carbon, a condensed aromatic ring; $R^4$ is a monovalent group selected from the group consisting of an aryl group, a heterocyclic group, hydrogen, an alkyl group, an alkoxycarbonyl group and carbamoyl, each of which may have one or more substituent groups.

The alkyl group which can constitute the $R^1$ may be of straight or branched chain. The alkyl group preferably contains 1–20 carbon atoms, more preferably contains 1–10 carbon atoms. Examples of the alkyl group include methyl, ethyl, butyl, t-butyl, t-amyl, 2-ethylhexyl, t-octyl, dodecyl and octadecyl.

The cycloalkyl group which can constitute the $R^1$ preferably contains 5–20 carbon atoms. Example of the cycloalkyl group is cyclohexyl.

The alkenyl group which can constitute the $R^1$ preferably contains 2–10 carbon atoms. Examples of the alkenyl group include vinyl and styryl.

Examples of the aryl group which can constitute the $R^1$ include phenyl, naphtyl and anthryl. Among them, phenyl is most preferred. Examples of the substituent group which can be attached to the aryl group include a halogen atom, an alkyl group, an alkoxyl group, cyano, carbamoyl, an alkylcarbamoyl group, sulfamoyl, an alkylsulfamoyl group, amino, an alkylamino group and an acylamino group. Among them, amino and an alkyl amino are most preferred.

The alkyl group which can substitute the aryl group preferably contains 1–10 carbon atoms. Examples of the alkyl group include methyl, ethyl, butyl, t-butyl, t-amyl, 2-ethylhexyl and t-octyl.

The alkoxyl group which can substitute the aryl group preferably contains 1–10 carbon atoms. Examples of the alkoxyl group include methoxyl, ethoxyl and 2-methoxyethoxyl.

Examples of the alkylcarbamoyl group which can substitute the aryl group include N,N-diethylcarbamoyl, N,N-dioctylcarbamoyl and N-methyl-N-octylcarbamoyl.

Examples of the alkylsulfamoyl group which can substitute the aryl group include N,N-diethylsulfamoyl, 2-ethylhexylaminosulfonyl, N,N-dibutylsulfamoyl, N,N-dioctylsulfamoyl, N-methyl-N-butylsulfamoyl and N-methyl-N-octadecylcarbamoyl.

Examples of the alkylamino group which can substitute the aryl group will be described in the following formula (II).

The acylamino group which can substitute the aryl group preferably contains 1–20 carbon atoms. Example of the acylamino group is 2-ethylhexanoylamino.

Examples of the aralkyl group which can constitute the $R^1$ include benzyl and diphenylmethyl.

Example of the alkynyl group which can consitute the $R^1$ is phenylethynyl.

Examples of the heterocyclic group which can constitute the $R^1$ include pyridyl, imidazolyl, benzimidazolyl, thiazolyl, phthalazinyl, quinolyl, isoquinolyl, furyl and tetrahydrofuryl.

Among the groups which can constitute the $R^1$, the alkyl group, the cycloalkyl group, the alkenyl group and the aryl group are preferred, the aryl group is more preferred, and phenyl is most preferred.

The aryl group which can constitute the $R^2$ and $R^3$ has the same meaning as that which can constitute the $R^1$, except that the aryl group having no substituent group is most preferred.

Alternatively, $R^2$ and $R^3$ can form, together with the neighboring carbon, a condensed aromatic ring. The condensed aromatic ring preferably is tricyclic. Examples of the condensed aromatic ring include xanthene ring and fluorene ring.

The aryl group can constitute the $R^4$ has the same meaning as that which can constitute the $R^2$ and $R^3$. $R^2$, $R^3$ and $R^4$ may be either identical or different from each other.

The alkyl group which can constitute the $R^4$ has the same meaning as that which can constitute the $R^1$, except that the alkyl group preferably contains 1–10 carbon atoms.

The alkoxycarbonyl group which can constitute the $R^4$ preferably contains 2–10 carbon atoms. An example of the alkoxycarbonyl group is methoxycarbonyl.

Examples of the substituted carbamoyl group which can constitute the $R^4$ include N,N-diethylcarbamoyl, N,N-dioctylcarbamoyl and N-methyl-N-octylcarbamoyl.

Among the groups which can constitute the $R^4$, the aryl group (including the substituted aryl group) is more preferred. The hydrazine derivative in which each of $R^2$, $R^3$ and $R^4$ in the formula (I) is phenyl is most preferred.

The most preferred hydrazine derivative has the following formula (II):

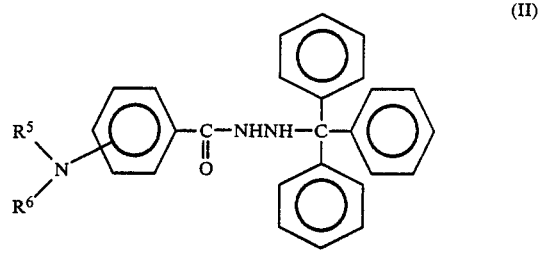

in which each of $R^5$ and $R^6$ independently is hydrogen or an alkyl group, or $R^5$ and/or $R^6$ form, together with the neighboring nitrogen, a heterocyclic ring which may be condensed with the neighboring phenyl; each of phenyls may be condensed with one or more benzene rings; and each of phenyls and the condensed aromatic ring may have one or more substituent groups.

The present inventors have further found that the hydrazine derivative having the formula (II) can be much more rapidly decomposed in a heat development process.

The alkyl group which can constitute the $R^5$ and $R^6$ may be either normal or branched. The number of the carbon atom in the alkyl group has an only small influence upon the function of the hydrazine derivative as a reducing agent, but the reducing agent having a small molecular weight is convenient for the preparation of the light-sensitive material. Therefore, the alkyl group preferably contains 1 to 20 carbon atoms, more preferably contains 1–6 carbon atoms.

Further, $R^5$ and/or $R^6$ can form, together with the neighboring nitrogen, a heterocyclic ring. The heterocyclic ring may be condensed with the neighboring phenyl.

Among them, each of the $R^5$ and $R^6$ preferably is an alkyl group.

Each of phenyls in the formula (II) may be condensed with one or more benzene rings. Each of phenyls and the condensed aromatic ring may have one or more substitutent groups (the phenyl to which the —$NR^5R^6$ is attached may have one or more the other substituent groups than the —$NR^5R^6$ group).

The phenyl to which the —$NR^5R^6$ is attached may have two or more the other substituent groups corresponding to to which the —$NR^5R^6$. Further, there is no specific limitation with respect to the position of —$NR^5R^6$ attached to the phenyl. Therefore, either of possible positions (i.e., ortho, meta and para) can be employed.

Examples of the substituent groups which can substitute phenyl and the condensed aromatic ring include an alkyl group, an alkoxyl group, hydroxyl, a halogen atom, an acylamino group and an acyloxyl group.

Examples of the hydrazine derivatives which are preferably used in the invention are described hereinafter.

(1)
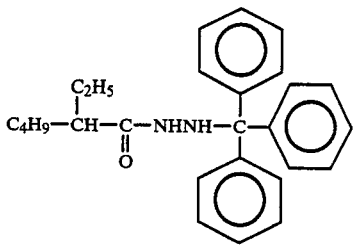

(2)
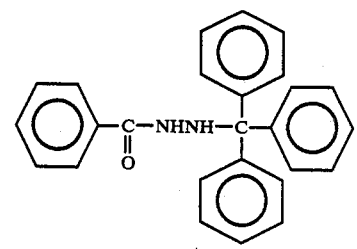

(3)
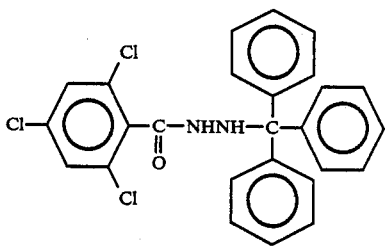

-continued (4)
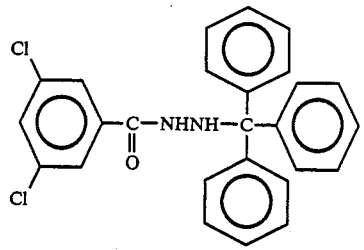

(5)
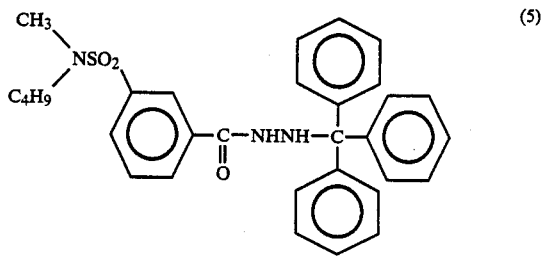

(6)
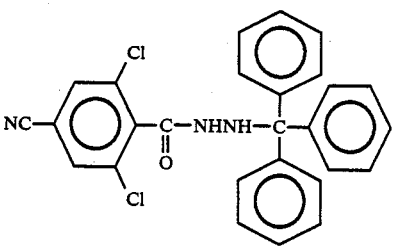

(7)
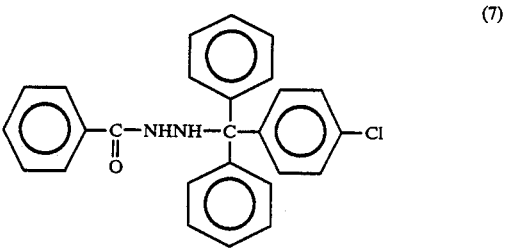

(8)
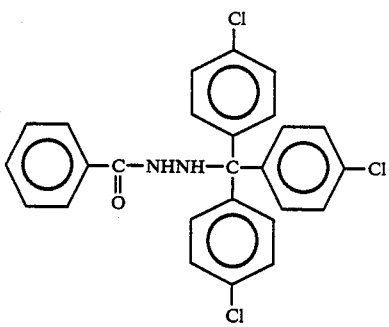

(9)
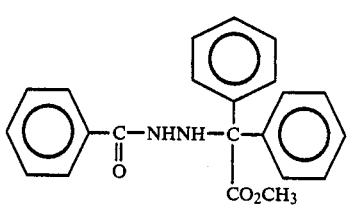

-continued
(10)
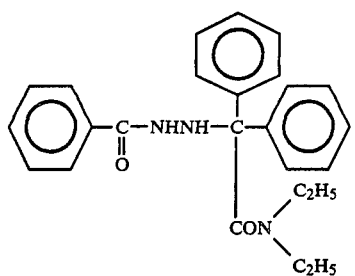
(11)
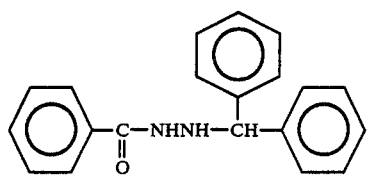
(12)
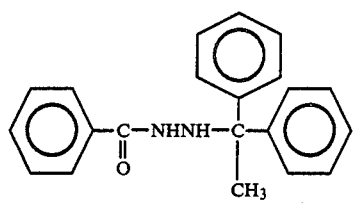
(13)
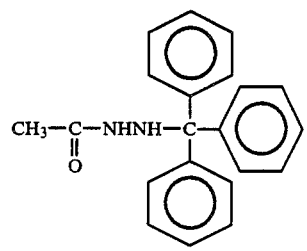
(14)
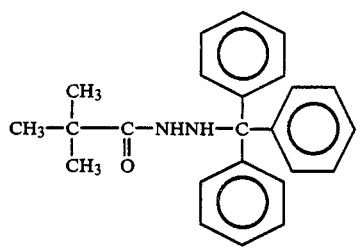
(15)
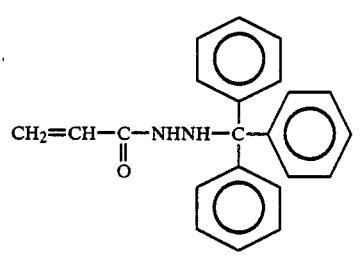
-continued
(16)
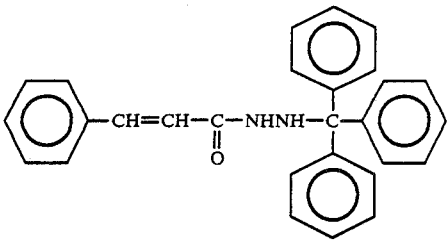
(17)
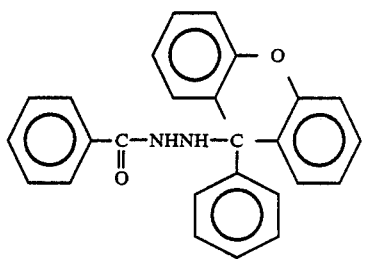
(18)
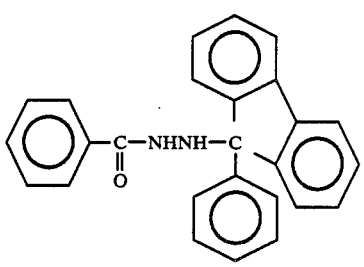
(19)
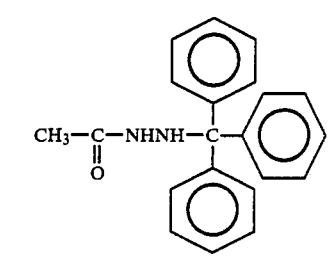
(20)
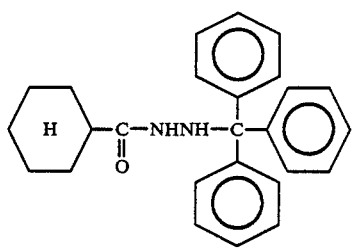
(21)
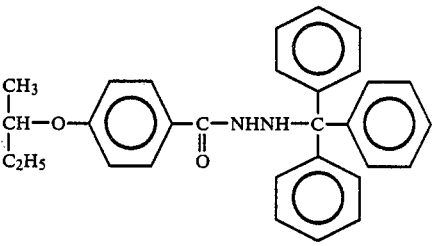

-continued
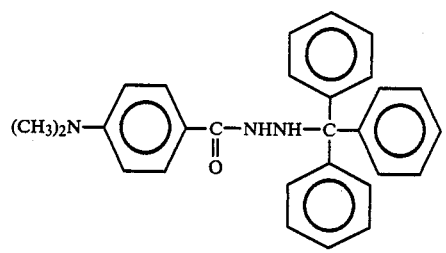 (22)
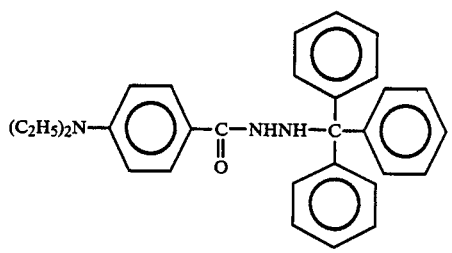 (23)
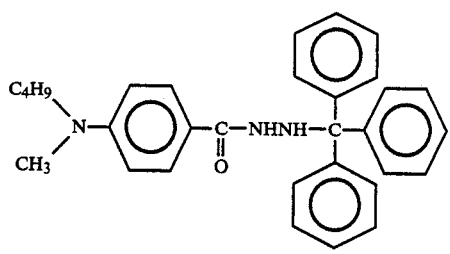 (24)
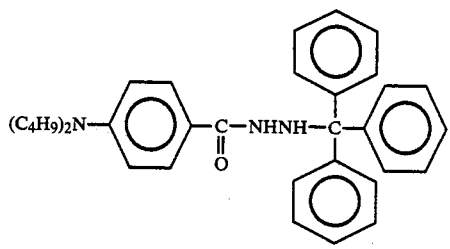 (25)
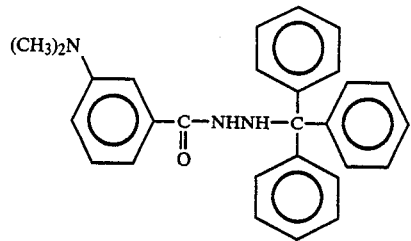 (26)
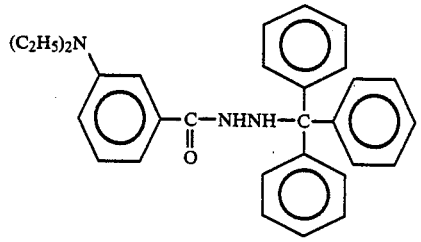 (27)
-continued
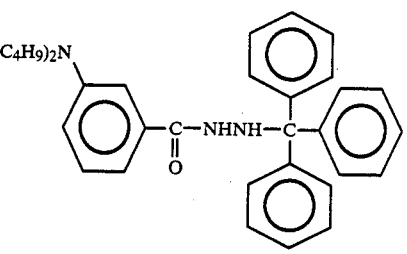 (28)
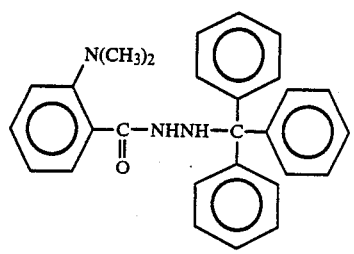 (29)
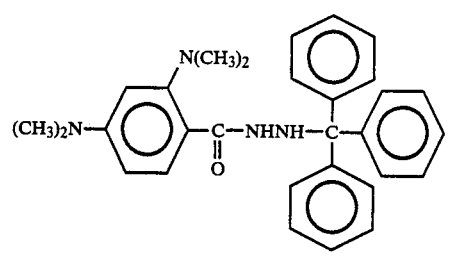 (30)
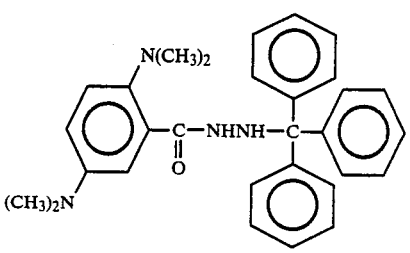 (31)
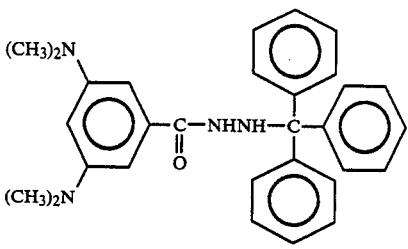 (32)
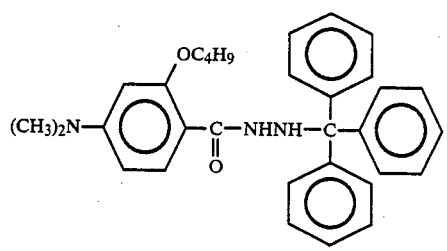 (33)

-continued
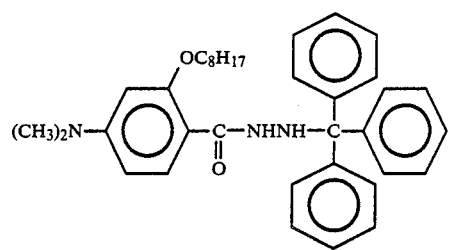 (34)
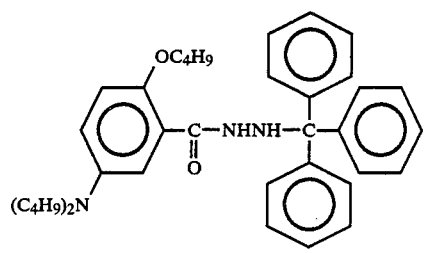 (35)
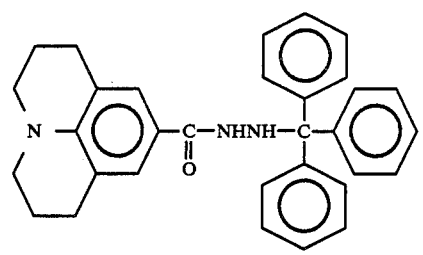 (36)
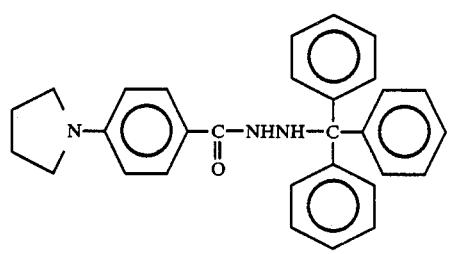 (37)
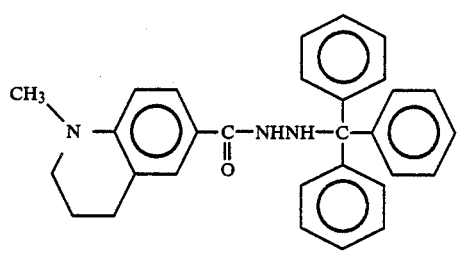 (38)
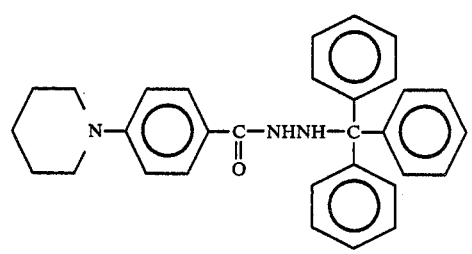 (39)
-continued
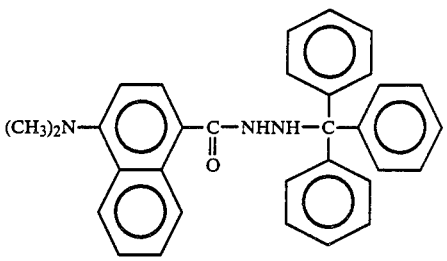 (40)
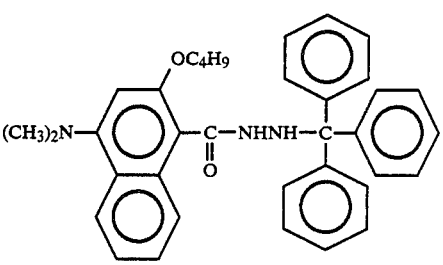 (41)
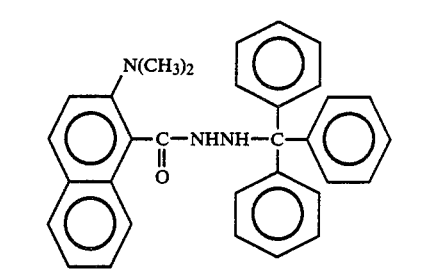 (42)
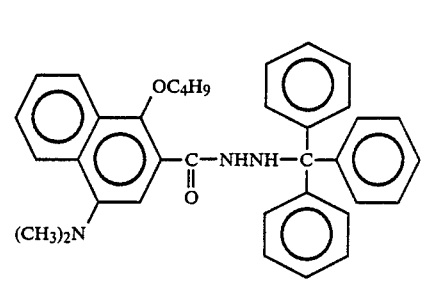 (43)
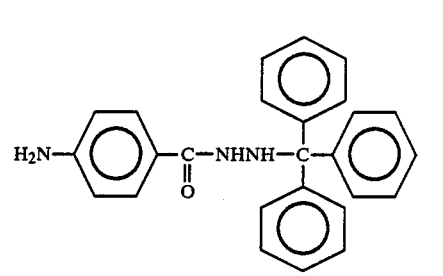 (44)
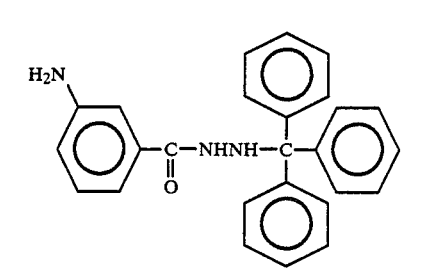 (45)

-continued

(46) 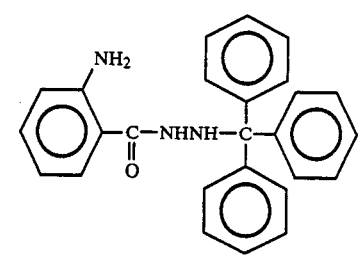

(47) 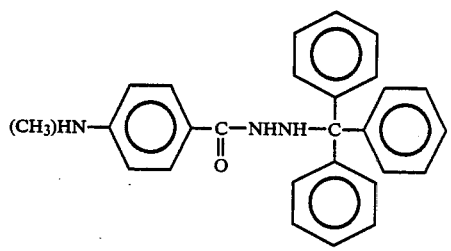

(48) 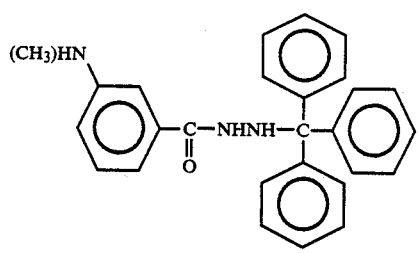

(49) 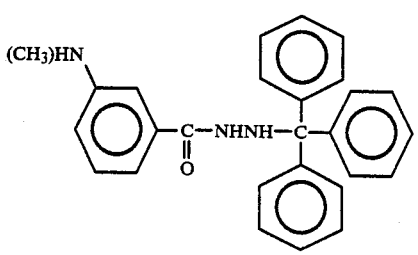

(50) 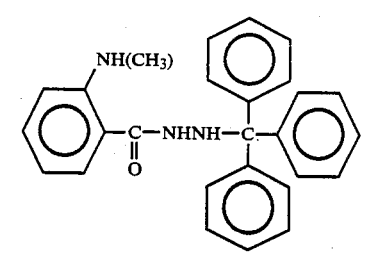

(51) 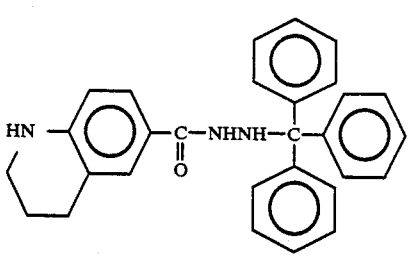

Some hydrazine derivatives as defined above are already known and described in publications. Accordingly, these derivatives can be synthesized according to the publications.

Synthesis examples of the hydrazine derivatives which can be used in the invention are described hereinafter. Other hydrazine derivatives can be synthesized in almost the same manner as in these synthesis examples.

SYNTHESIS EXAMPLE 1

Synthesis of 1-benzoyl-2-tritylhydrazine (1)

To a mixture of 13.6 g of benzoylhydrazide (0.1 mole), 14 ml of triethylamine and 100 ml of acetonitrile was portionwise added 30.7 g of trityl chloride at room temperature while stirring. The resulting mixture was stirred for 30 minutes at 40° C., then allowed to stand at room temperature. The reaction mixture was poured into 500 ml of water. Thus separated crystals were collected on a filter under reduced pressure and washed with water. The obtained crude crystals were recrystallized from methanol to obtain 30.3 g of colorless crystals, yield 80%, m.p. 130°-131° C.

SYNTHESIS EXAMPLE 2

Synthesis of 1-(p-diethylaminobenzoyl)-2-tritylhdrazine (23)

To 120 ml of methanol was added 25 g of p-diethylaminobenzoic acid. Into the mixture was introduced 60 g of gaseous hydrogen chloride over a period of 2 hours.

The reaction mixture was then heated to 50° C. and stirred for 1 hour. The reaction mixture was then poured into an aqueous solution of sodium hydrogencarbonate, and the mixture was extracted with ethyl acetate. The organic phase was dried over magnesium sulfate, and the insoluble material was collected on a filter. The remaining solvent was distilled off under reduced pressure. To the residue were added 50 ml of hydrazine hydrate and 20 ml of ethanol, and the mixture was refluxed for 5 hours.

Further, the reaction mixture was poured into water, and the mixture was extracted with ethyl acetate. The organic phase was washed with water, and dried over magnesium sulfate. The insoluble material was collected on a filter and the remaining solvent was distilled off under reduced pressure. The residue was crystallized by addition of ethanol. The crude crystals were recrystallized from ethanol to obtain 25 g of the desired hydrazine derivative as light yellow crystals, m.p. 121°-122° C.

The hydrazine derivative having the formula (I) can be used singly or in combination of two or more compounds.

The amount of the hydrazine derivative in the light-sensitive layer preferably ranges from 0.1 to 1,500 mole % based on the amount of silver (contained in the silver halide and an organic silver salt), and more preferably ranges from 10 to 500 mole %.

Further, the hydrazine derivative of the formula (I) can be used in combination with other hydrazine derivative and/or other reducing agent.

Examples of other hydrazine derivative include 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)butyloyl}-

-2-(p- or o-aminophenyl)hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl} phenyl]hydrazine, 1-{4-(2,5-di-tert-pentylphenoxy)-butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)butylamide} phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl} phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl}phenyl]hydrazine.

Examples of other reducing agent employable in combination with the hydrazine derivative of the invention include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles and α-sulfonamidoketones. Concrete examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxy-phenol, 2-(N-butylcarbamoyl-4-phenylsulfonylaminonaphtol and 2-(N-methyl-N-octadecylcarbamoyl)-4-sulfonylaminonaphthol.

These reducing agents (including compounds referred to as developing agent or hydrazine derivative) which can be used in combination with the hydrazine derivative having the formula (I) are described in Japanese Patent Provisional Publication Nos. 61(1986)-183640, 61(1986)-188535 and 61(1986)-228441, and Japanese Patent Application Nos. 60(1985)-210657, 60(1985)-226084, 60(1985)-227527 and 60(1985)-227528. These reducing agents are also described in T. James, "The Theory of the Photographic Process", 4th edition, 291-334 (1977), Research Disclosure No. 17029, 9-15 (June 1978), and Research Disclosure No. 17643, 22-31 (December 1978).

In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

The silver halide, the polymerizable compound and the support which constitute the light-sensitive material of the invention with the hydrazine derivative (reducing agent) are described below. Thus composed material is referred to hereinafter as "light-sensitive material".

There is no specific limitation with respect to silver halide contained in the light-sensitive layer of the light-sensitive material.

Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Pat. No. 100,984) can be employed.

There is no specific limitation on the crystal habit of silver halide grains. Two or more kinds of silver halide grains which differ in halogen composition, crystal habit, grain size, and/or other features from each other can be used in combination. There is no specific limitation on grain size distribution of silver halide grains. The silver halide grains ordinarily have a mean size of 0.001 to 5 μm, more preferably 0.001 to 2 μm.

The total silver content (including the silver halide and an organic silver salt which is one of optional components) in the light-sensitive layer preferably in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material of the invention are described in the above-mentioned and later-mentioned publications and applications concerning the light-sensitive material.

Preferred polymerizable compounds employable for the light-sensitive materials are compounds which are polymerizable through addition reaction or ring-opening reaction. Preferred examples of the compounds being polymerizable through addition reaction includes compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material of the invention can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. A light-sensitive material in which the polymerizable compound is dispersed in the form of oil droplets is describbed in Japanese Patent Application No. 60(1985)-218603. Other components in the light-sensitive layer, such as silver halide, the reducing agent, the color image formingg substances may be also contained in the oil droplets. A light-sensitive material in which silver halide is contained in the oil droplets is described in Japanese Patent Application No. 60(1985)-261888.

The oil droplets of the polymerizable compound are preferably prepared in the form of microcapsules. There is no specific limitation on preparation of the microcapsules. The light-sensitive material in which the oil droplets are present in the form of a microcapsule is described in Japanese Patent Application No. 60(1985)-117089. There is also no specific limitation on shell material of the microcapsule, and various known materials such as polymers which are employed in the conventional microcapsules can be employed as the shell material. The mean size of the microcapsule preferably ranges from 0.5 to 50 µm, more preferably 1 to 25 µm, most preferably 3 to 20 µm.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminer promoted by the Society of Kinki Chemical Industry, "The Newest Chemistry of Coloring Matter-Attractive Application and New Development as a Functional Coloring Matter", 26-32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material of the invention. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide.

The sensitizing dye is preferably added during the stage of the preparation of the silver halide emulsion. The light-sensitive material wherein the sensitizing dye has been added during the silver halide grain formation is described in Japanese Patent Application No. 60(1985)-139746. The examples of the sensitizing dye are also described in above Japanese Patent Application No. 60(1985)-139746.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect. The light-sensitive material employing an organic silver salt is described in Japanese Patent Application No. 60(1985)-141799.

Various image formation accelerators are employable in the light-sensitive material of the invention. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inoragnic bases, organic bases, base precursors, oils, surface active agents, hot-melt solvents, and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxyalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

The light-sensitive material employing base or base precursor is described in Japanese Patent Application No. 60(1985)-227528.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure 26-28 (December 1976). The light-sensitive material employing the hot-melt solvents is described in Japanese Patent Application No. 60(1985)-227527. The hot-melt solvent is preferably used in an amount of from 0.5 to 50% by weight, and more preferably from 1 to 20% by weight, based on the total solid content of the light-sensitive layer.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6-18, edited by the Editorial Committee of High Polymer Experimental Study of the High Polymer Institute, published by Kyoritsu Shuppan (1983). Examples of the thermal polymerization initiators include azo compounds, e.g. azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles, such as particles of talc, kaolin, bentonite, agalmatolite, zinc oxide, titanium oxide or almina described in U.S. Pat. No. 2,711,375. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062.

Examples and usage of the other optional components which can be contained in the light-sensitive layer are also described in the above-mentioned publications and applications concerning the light-sensitive material, and in Research Disclosure Vol. 170, No. 17029, 9-15 (June 1978).

Examples of auxiliary layers which are optionally arranged on the light-sensitive material include an image-receiving layer, a heating layer, an antistatic layer, an anticurl layer and a release layer.

Instead of the use of the image-receiving material, the image-receiving layer can be arranged on the light-sensitive material to produce the desired image on the on the image-receiving layer of the light-sensitive material. The image-receiving layer of the light-sensitive material can be constructed in the same manner as the layer of the image-receiving layer. The details of the image-receiving layer will be described later.

The light-sensitive material employing the heating layer is described in Japanese Patent Application No. 60(1985)-135568 (corresponding to European Patent Provisional Publication No. 203613A). Examples and usage of the other auxiliary layers are also described in the above-mentioned publications and applications concerning the light-sensitive material.

The light-sensitive material of the invention can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and the halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent.

Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added the silver halide emulsion, the sensitizing dye is preferably added during the preparation of the emulsion as described in Japanese Patent Application No. 60(1986)-139746. When the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion), the reducing agent, or the color image forming substance can be dissolved, emulsified or dispersed in the polymerizable compound to prepare the light-sensitive material. Especially, the color image forming substance is preferably incorporated in the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispersed state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. No. 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion.

The hydrazine derivative is preferably incorporated into the polymerizable compound (including the light-sensitive composition) to prepare the light-sensitive material of the invention. The hydrazine derivative can be directly added to the polymerizable compound, or dispersed in an adequate medium (e.g., methylene chloride) prior to the addition to the polymerizable compound.

Alternatively, the hydrazine derivative can be incorporated into the emulsion of the polymerizable compound or the coating solution to prepare the light-sensitive material of the invention.

A light-sensitive material of the invention can be prepared by coating and drying the above-prepared coating solution on a support in the conventional manner.

Use of the light-sensitive material is described below.

In the use o the light-sensitive material of the invention, a development process is conducted simultaneously with or after an imagewise exposure.

Various exposure means can be employed in the image-wise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Application No. 60(1985)-135568. Heating temperatures for the development process usually ranges from 80° C. to 200° C., and preferably from 100° C. to 160° C. Various heating patterns are applicable. The heating time is usually from 1 second to 5 minutes, and preferably from 5 seconds to 1 minute.

In the above development process, a polymer image can be formed on the light-sensitive layer. A pigment image can be also obtained by fixing pigments to the polymer image.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include baryta paper in addition to various examples which can be employed as the support of the known light-sensitive material.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer.

The image-receiving layer can be composed of two or more layers according to the above-mentioned functions. The thickness of the image-receiving layer preferably ranges from 1 to 100 μm, more preferably from 1 to 20 μm.

After the development process, pressing the light-sensitive material in contact with the image-receiving material to transfer the polymerizable compounds which is still polymerizable to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material in contact with the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of silver halide emulsion

In 3 l of water were dissolved 40 g of gelatin and 23.8 g of potassium bromide, and the resulting gelatin solution was kept at 50° C. To the gelatin solution, 200 ml of an aqueous solution containing 34 g of silver nitrate was added over a period of 10 minutes while stirring. To the solution, 100 ml of an aqueous solution containing 3.3 g of potassium iodide was added over a period of 2 minutes to obtain a silver bromoiodide emulsion. After the emulsion was adjusted to a pH or sedimentation, excess salts were removed, and the emulsion was adjusted to a pH of 6.0. The yield of the emulsion was 400 g.

Preparation of light-sensitive composition

In 100 g of trimethylolpropane triacrylate were dissolved 0.40 g of the following copolymer and 6.00 g of Pargascript Red I-6-B (produced by Chiba-Geigy).

(Copolymer)

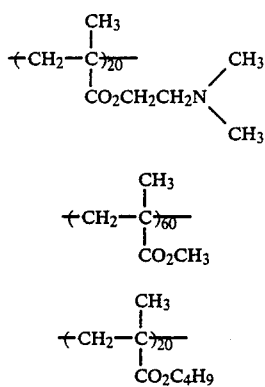

To 18.00 g of the resulting solution were added 1.08 g of the following hydrazine derivative (a) (i.e., reducing agent (I)), 1.22 g of the following reducing agent (II), 0.20 g of 1% ethyl acetate solution of the following antifogging agent and 2 g of Emulex NP-8 (tradename, preduced by Nippon Emulsion Co., Ltd.), and the resulting mixture was made uniform.

(Hydrazine derivative (a))

-continued

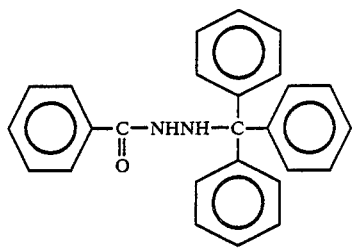

(Reducing agent II)

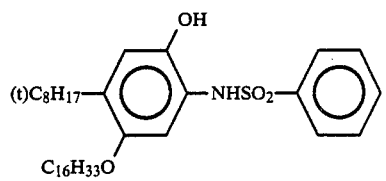

(Antifogging agent)

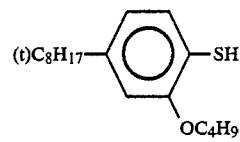

Further, to the resulting mixture was added 4.06 g of the silver halide emulsion, and the mixture was stirred at 15,000 r.p.m. for 5 minutes to obtain a light-sensitive composition.

Preparation of light-sensitive microcapsule

To 10.51 g of 18.6% aqueous solution of Isobam (tradename, produced by Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 min. to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde, and 2.74 g of 8.76% aqueous solution of ammonium sulfate in this order, and the mixture was heated at 60° C. for 2 hours while stirring. After the mixture was adjusted to a pH of 7.2 using 10% aqueous solution of sodium hydroxide, 3.62 g of 30.9% aqueous solution of sodium hydrogen sulfite was added to the mixture to obtain a dispersion containing light-sensitive microcapsules.

Preparation of light-sensitive material

To 10.0 g of the light-sensitive microcapsule dispersion were added 1.0 g of 10% aqueous solution of Emulex NP-8 (tradename, preduced by Nippon Emulsion Co., Ltd.) and 1.84 g of 10% solution (solvent: water/ethanol=50/50 as volume ratio) of guanidine trichroloacetate to prepare a coating solution. The coating solution was uniformly coated on a polyethylene terephthalate film (thickness: 100 μm) using a coating rod of #40 to a wet thickness of 70 μm and dried at about 25° C. to obtain a light-sensitive material (A).

EXAMPLE 2

Preparation of light-sensitive composition

Light-sensitive composition was prepared in the same manner as in Example 1 except that 1.16 g of the following hydrazine derivative (b) was used in place of 1.08 g of the hydrazine derivative (a).

(Hydrazine derivative (b))

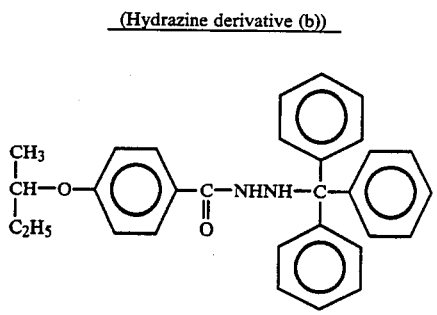

Preparation of light-sensitive microcapsule

Dispersion of light-sensitive microcapsule was prepared in the same manner as in Example 1 except that the above light-sensitive composition was used.

Preparation of light-sensitive material

Light-sensitive material (B) was prepared in the same manner as in Example 1 except that the above light-sensitive microcapsule was used.

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform.

The mixture was then uniformly coated on an art paper having a weight of 43 g/m² to give a layer having a wet thickness of 30 μm and dried to obtain an image-receiving material.

Evaluation of light-sensitive material

Each of the light-sensitive materials prepared in Examples 1 and 2 was imagewise exposed to light using a tungsten lamp at 2,000 lux for 1 second and then heated on a hot plate at 125° C. for 20 seconds or 40 seconds. Each of the exposed and heated light-sensitive materials was then combined with the image-receiving material and passed through press rolls under pressure of 350 kg/cm² to obtain a magenta positive image on the image receiving material. The density of the obtained image was measured using Macbeth reflection densitometer. The results are set forth in Table 1.

TABLE 1

| Light-Sensitive Material | Hydrazine Derivative | (Heating time) 20 seconds | | 40 seconds | |
|---|---|---|---|---|---|
| | | Maximum Density | Minimum Density | Maximum Density | Minimum Density |
| (A) | (a) | 1.22 | 0.31 | 1.20 | 0.19 |
| (B) | (b) | 1.14 | 0.19 | 1.12 | 0.11 |

It is apparent from the results in Table 1 that each of the light-sensitive materials using the hydrazine derivative forms an improved positive image which has a high contrast in a short development time. It is also apparent that each of the light-sensitive materials forms an image having high maximum density when the heating time is extended to reduce the occurrence of the fog.

EXAMPLE 3

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 minutes. Excess salts were sedimented and removed from the resulting emulsion by pH-adjustment. Thereafter, the emulsion was adjusted to a pH of 6.30 to obtain a silver benzotriazole emulsion. The yield of the emulsion was 400 g.

Preparation of light-sensitive composition

In 100 g of trimethylolpropane triacrylate were dissolved 0.40 g of the copolymer used in Example 1 and 6.00 g of Pargascript Red I-6-B (produced by Chiba-Geigy). To 18.00 g of the resulting solution was added a solution in which 7.3 g of the following hydrazine derivative (c) (i.e., reducing agent (I)) and 1.22 g of the reducing agent (II) used in Example 1 were dissolved in 1.8 g of methylene chloride.

(Hydrazine derivative (c))

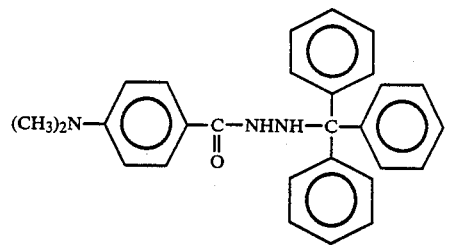

Further, to the resulting mixture were added 4.06 g of the silver halide emulsion used in Example 1 and 3.35 g of the above silver benzotriazole emulsion, and the mixture was stirred at 15,000 r.p.m. for 5 minutes to obtain a light-sensitive composition.

Preparation of light-sensitive microcapsule

Dispersion of light-sensitive microcapsule was prepared in the same manner as in Example 1 except that the above light-sensitive composition was used.

Preparation of light-sensitive material

Light-sensitive material (C) was prepared in the same manner as in Example 1 except that the above light-sensitive microcapsule was used.

EXAMPLE 4

Preparation of light-sensitive composition

Light-sensitive composition was prepared in the same manner as in Example 3 except that 0.3 g of the following hydrazine derivative (d) was used in place of 7.3 g of the hydrazine derivative (c).

(Hydrazine derivative (d))

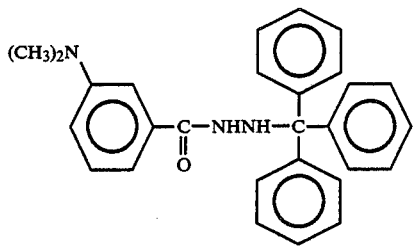

Preparation of light-sensitive microcapsule

Dispersion of light-sensitive microcapsule was prepared in the same manner as in Example 1 except that the above light-sensitive composition was used.

Preparation of light-sensitive material

Light-sensitive material (D) was prepared in the same manner as in Example 1 except that the above light-sensitive microcapsule was used.

EXAMPLE 5

Preparation of light-sensitive composition

Light-sensitive composition was prepared in the same manner as in Example 3 except that 0.28 g of the hydrazine derivative (a) used in Example 1 was used in place of 7.3 g of the hydrazine derivative (c).

Preparation of light-sensitive microcapsule

Dispersion of light-sensitive microcapsule was prepared in the same manner as in Example 1 except that the above light-sensitive composition was used.

Preparation of light-sensitive material

Light-sensitive material (E) was prepared in the same manner as in Example 1 except that the above light-sensitive microcapsule was used.

Evaluation of light-sensitive material

Each of the light-sensitive materials prepared in Examples 3, 4 and 5 was fully exposed to light using a tungsten lamp at 200 lux for 1 second and then heated on a hot plate at 125° C. for 10 seconds or 20 seconds. Each of the exposed and heated light-sensitive materials was then combined with the image-receiving material and passed through press rolls under pressure of 350 kg/cm$^2$ to obtain a magenta positive image on the image receiving material. The density of the obtained image was measured using Macbeth reflection densitometer.

Further, each of the light-sensitive materials was evaluated in the same manner as in the above process except that each of the materials was not exposed.

The above results are set forth in Table 2. In Table 2, "Maximum Density" is referred to as the reflection density in the case that the material was not exposed, which corresponds to the unexposed area. Further, "Mimimum Density" is referred to as the reflection density in the case that the material was exposed, which corresponds to the exposed area.

TABLE 2

| Light-Sensitive Material | Hydrazine Derivative | (Heating time) | | | |
|---|---|---|---|---|---|
| | | 10 seconds | | 20 seconds | |
| | | Maximum Density | Minimum Density | Maximum Density | Minimum Density |
| (C) | (c) | 1.13 | 0.25 | 1.26 | 0.10 |
| (D) | (d) | 1.30 | 0.75 | 1.28 | 0.20 |
| (E) | (a) | 1.30 | 1.05 | 1.25 | 0.50 |

It is apparent from the results in Table 2 that each of the light-sensitive materials using the hydrazine derivative forms an improved positive image which has a high contrast. It is also apparent that each the light-sensitive materials (C) and (D) also forms an improved image even in a very short heating time.

We claim:

1. In a light-sensitive material comprising a light-sensitive layer which contains silver halide, a reducing agent and a polymerizable compound provided on a support, the improvement wherein the reducing agent is a hydrazine derivative having the following formula (I):

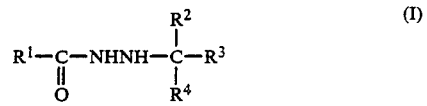

in which R$^1$ is a monovalent group selected from the group consisting of hydrogen, an alkyl group, a cycloalkyl group, an alkenyl group, an aryl group, an aralkyl group, an alkynyl group and a heterocyclic group, each of which may have one or more substituent groups; each of R$^2$ and R$^3$ independently is an aryl group which may have one or more substituent groups, or R$^2$ and R$^3$ form, together with the neighboring carbon, a condensed aromatic ring; R$^4$ is a monovalent group selected from the group consisting of an aryl group, a heterocyclic group, hydrogen, an alkyl group, an alkoxycarbonyl group and carbamoyl, each of which may have one or more substituent groups.

2. The light-sensitive material as claimed in claim 1, wherein R$^1$ is a monovalent group selected from the group consisting of an alkyl group containing 1–20 carbon atoms, cyclohexyl, an alkenyl group containing 2–10 carbon atoms, an aryl group and styryl, each of which may have one or more substituent groups.

3. The light-sensitive material as claimed in claim 1, wherein R$^1$ is an alkyl group containing 1–10 carbon atoms or an aryl group and styryl, each of which may have one or more substituent groups.

4. The light-sensitive material as claimed in claim 1, wherein each of R$^2$ and R$^3$ independently is phenyl which may have one or more substituent groups, or R$^2$ and R$^3$ form, together with the neighboring carbon, xanthene ring or fluorene ring.

5. The light-sensitive material as claimed in claim 1, wherein each of R$^2$, R$^3$ and R$^4$ is phenyl.

6. The light-sensitive material as claimed in claim 1, wherein the hydrazine deriative has the following formula (II):

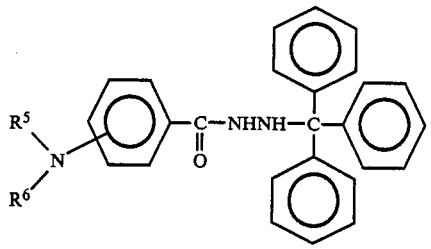

(II)

in which each of $R^5$ and $R^6$ independently is hydrogen or an alkyl group, or $R^5$ and/or $R^6$ form, together with the neighboring nitrogen, a heterocyclic ring which may be condensed with the neighboring phenyl; each of phenyls may be condensed with one or more benzene rings; and each of phenyls and the condensed ring may have one or more substituent groups.

7. The light-sensitive material as claimed in claim 6, wherein each of $R^5$ and $R^6$ independently is an alkyl group.

8. The light-sensitive material as claimed in claim 6, wherein each of $R^5$ and $R^6$ independently is an alkyl group containing 1–20 carbon atoms.

9. The light-sensitive material as claimed in claim 6, wherein each of $R^5$ and $R^6$ independently is an alkyl group containing 1–6 carbon atoms.

10. The light-sensitive material as claimed in claim 1, wherein the hydrazine derivative is contained in an amount of from 0.1 to 1,500 mole % based on the total silver content in the light-sensitive layer.

11. The light-sensitive material as claimed in claim 1, wherein the light-sensitive layer further contains a color image forming substance.

12. The light-sensitive material as claimed in claim 1, wherein the polymerizable compound is dispersed in the light-sensitive layer in the form of oil droplets, and silver halide and the hydrazine derivative are contained in the oil droplets.

13. The light-sensitive material as claimed in claim 1, wherein the polymerizable compound is contained in microcapsules which are dispersed in the light-sensitive layer, and silver halide and the hydrazine derivative are contained in the microcapsules.

14. The light-sensitive material as claimed in claim 1, wherein the light-sensitive layer further contains another reducing agent than the hydrazine derivative.

15. An image-forming method which comprises:
imagewise exposing a light-sensitive material comprising a light-sensitive layer provided on a support wherein the light-sensitive layer contains silver halide, a polymerizable compound and a hydrazine derivative having the following formula (I):

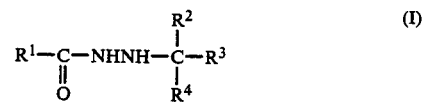

(I)

in which $R^1$ is a monovalent group selected from the group consisting of hydrogen, an alkyl group, a cycloalkyl group, an alkenyl group, an aryl group, an aralkyl group, an alkynyl group and a heterocyclic group, each of which may have one or more substituent groups; each of $R^2$ and $R^3$ independently is an aryl group which may have one or more substituent groups, or $R^2$ and $R^3$ form, together with the neighboring carbon, a condensed aromatic ring; $R^4$ is a monovalent group selected from the group consisting of an aryl group, a heterocyclic group, hydrogen, an alkyl group, an alkoxycarbonyl group and carbamoyl, each of which may have one or more substituent groups, to form a latent image of the silver halide; and simultaneously or thereafter heating the light-sensitive material to polymerize the polymerizable compound within the area where the latent image of the silver halide has been formed.

16. The image-forming method as claimed in claim 15, wherein after heating the light-sensitive material, the light-sensitive material is pressed on an image-receiving material to transfer the obtained image to the image-receiving material.

17. The image-forming method as claimed in claim 15, wherein the hydrazine derivative is contained in an amount of from 0.1 to 1,500 mole % based on the total silver content in the light-sensitive layer of the light-sensitive material.

* * * * *